United States Patent
Lu

(10) Patent No.: US 11,846,670 B2
(45) Date of Patent: Dec. 19, 2023

(54) CHIP TESTING BOARD AND CHIP TESTING METHOD

(71) Applicant: CHANGXIN MEMORY TECHNOLOGIES, INC., Hefei (CN)

(72) Inventor: Zongzheng Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 157 days.

(21) Appl. No.: 17/597,412

(22) PCT Filed: Jun. 18, 2021

(86) PCT No.: PCT/CN2021/100830
§ 371 (c)(1),
(2) Date: Jan. 5, 2022

(87) PCT Pub. No.: WO2022/156132
PCT Pub. Date: Jul. 28, 2022

(65) Prior Publication Data
US 2023/0057650 A1      Feb. 23, 2023

(30) Foreign Application Priority Data

Jan. 22, 2021   (CN) .......................... 202110089574.0

(51) Int. Cl.
*G01R 31/28*          (2006.01)
(52) U.S. Cl.
CPC ................ *G01R 31/2884* (2013.01)
(58) Field of Classification Search
CPC ............ G01R 31/2884; G01R 31/2886; G01R 1/0433; G01R 31/2896; G01R 31/2889
(Continued)

(56) References Cited

U.S. PATENT DOCUMENTS 3,436,604 A * 4/1969 Luecke ............... H01L 23/5384
                                                                257/664
5,615,475 A * 4/1997 Burns ................. H01L 23/4951
                                                                257/E23.092

(Continued)

FOREIGN PATENT DOCUMENTS

CN      103399225 A     11/2013
CN      103823149 A     5/2014
(Continued)

OTHER PUBLICATIONS

International Search Report cited in PCT/CN2021/100830 dated Oct. 21, 2021, 11 pages.

*Primary Examiner* — Giovanni Astacio-Oquendo
(74) *Attorney, Agent, or Firm* — Cooper Legal Group, LLC

(57) ABSTRACT

A chip testing board and a chip testing method are provided. The testing board includes a first conductive layer, a second conductive layer and a third conductive layer, wherein the first conductive layer is located on a substrate for electrical connection with a first power connection point of a chip, and one side of the first conductive layer leads to a first test point; the second conductive layer is located on the first conductive layer for electrical connection with a second power connection point of the chip, and one side of the second conductive layer leads to a second test point; and the third conductive layer is located on the second conductive layer for electrical connection with a third power connection point of the chip, and one side of the third conductive layer leads to a third test point.

20 Claims, 4 Drawing Sheets

(58) Field of Classification Search
USPC .................................. 324/762.01, 537, 500
See application file for complete search history.

(56) References Cited

U.S. PATENT DOCUMENTS

| | | | |
|---|---|---|---|
| 6,642,727 | B1 | 11/2003 | Rohde et al. |
| 9,263,410 | B2 | 2/2016 | Guo |
| 2001/0005042 | A1* | 6/2001 | Burns ............... H01L 23/49541 |
| | | | 257/676 |

FOREIGN PATENT DOCUMENTS

| | | | |
|---|---|---|---|
| CN | 105865319 | A | 8/2016 |
| CN | 106526449 | A | 3/2017 |
| CN | 109192018 | A | 1/2019 |
| CN | 109240873 | A | 1/2019 |
| CN | 109587933 | A | 4/2019 |
| CN | 112904180 | A | 6/2021 |

* cited by examiner

CHIP TESTING BOARD AND CHIP TESTING METHOD

CROSS-REFERENCE TO RELATED APPLICATIONS

The present application claims the priority to Chinese Patent Application 202110089574.0, titled "CHIP TESTING BOARD AND CHIP TESTING METHOD", filed on Jan. 22, 2021, which is incorporated herein by reference in its entirety.

TECHNICAL FIELD

The present application relates to a chip testing board and a chip testing method.

BACKGROUND

Chip dies and different types of frames or molding compounds form chip packages. There are many types of chip packages. Generally, the chip packages can be divided into different types according to packaging materials for the chip packages, connection modes of the chip packages and Printed circuit boards (PCB), and shapes of the chip packages. The different types of chip packages are different in testing method and test process.

With the rapid development of semiconductor and integrated circuit technology, the market demand for chip products is increasing, and the requirements for the production efficiency of chip suppliers are getting higher and higher. In order to improve the quality of chip supply, chip suppliers need to continuously improve the test capability and test efficiency on manufactured chips.

SUMMARY

According to multiple embodiments, the first aspect of the present application provides a chip testing board, including:
  a first conductive layer located on a substrate, the first conductive layer being configured to electrically connect with a first power connection point of a chip, and one side of the first conductive layer leading to a first test point;
  a second conductive layer located on the first conductive layer, the second conductive layer being configured to electrically connect with a second power connection point of the chip, and one side of the second conductive layer leading to a second test point; and
  a third conductive layer located on the second conductive layer, the third conductive layer being configured to electrically connect with a third power connection point of the chip, and one side of the third conductive layer leading to a third test point;
  wherein, the first test point, the second test point, and the third test point are all located at an edge of the same side of the substrate.

According to multiple embodiments, the second aspect of the present application provides a chip testing board, including:
  a substrate having a first surface and a second surface opposite to each other, a chip is disposed on the first surface, the second surface is provided with a first test point, a second test point and a third test point, and a first power connection point, a second power connection point and a third power connection point are arranged on the first surface or the second surface;
  a first conductive pillar, a second conductive pillar and a third conductive pillar are disposed in the substrate;
  the first conductive pillar is configured to electrically connect a first conductive boss of the chip with the first test point;
  the second conductive pillar is configured to electrically connect a second conductive boss of the chip with the second test point; and
  the third conductive pillar is configured to electrically connect a third conductive boss of the chip with the third test point.

According to multiple embodiments, the third aspect of the present application provides a chip testing board, including:
  a substrate, in the substrate a first conductive pillar, a second conductive pillar and a third conductive pillar are disposed;
  a first conductive layer, disposed on an upper surface of the substrate, an upper surface of the first conductive layer being configured to electrically connect with a first power connection point of a chip, and the first conductive layer being electrically connected to a first test point via the first conductive pillar;
  a second conductive layer disposed on the first conductive layer, an upper surface of the second conductive layer being configured to electrically connect with a second power connection point of the chip, and the second conductive layer being electrically connected to a second test point via the second conductive pillar; and
  a third conductive layer disposed on the second conductive layer, an upper surface of the third conductive layer being configured to electrically connect with a third power connection point of the chip, and the third conductive layer being electrically connected to a third test point via the third conductive pillar.

Details of one or more embodiments of the present application are set forth in the following accompanying drawings and description. Other features and advantages of the present application will become apparent from the specification, the drawings and the claims.

BRIEF DESCRIPTION OF THE DRAWINGS

In order to better describe and illustrate those embodiments and/or examples of the present application disclosed herein, one or more accompanying drawings may be referred to. The additional details or examples used to describe the drawings should not be considered as limiting the scope of any of the disclosed application, the currently described embodiments and/or examples, and the best mode of the present application currently understood.

DETAILED DESCRIPTION

Figure 1:
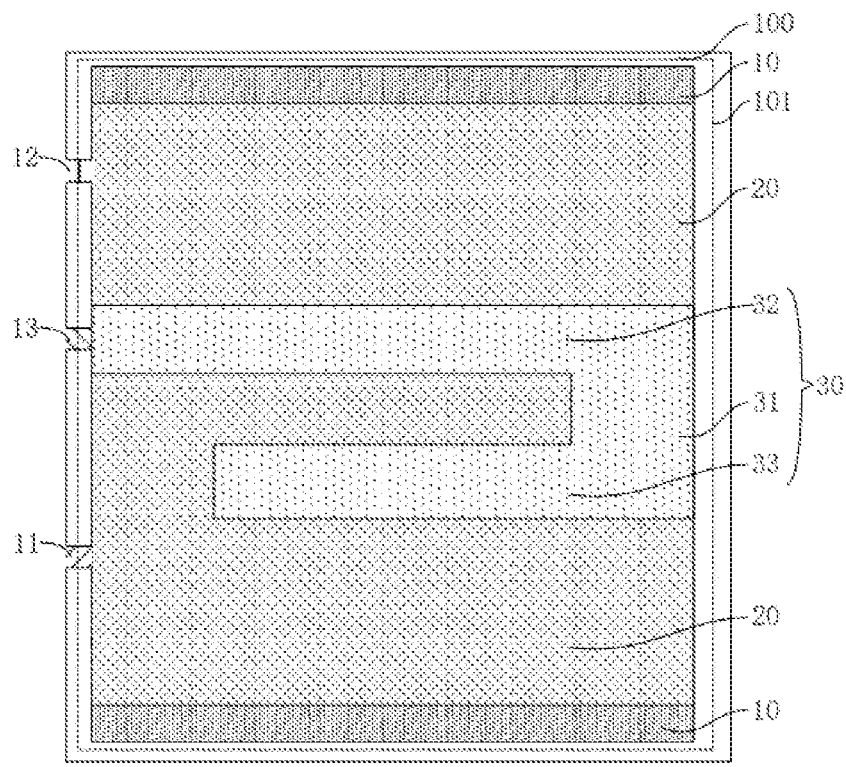
FIG. 1 is a schematic top view of a chip testing board according to a first embodiment of the present application.

Traditional chip testing methods or testing carrier substrates cannot meet the requirements for the test efficiency and test precision of semiconductor memory chips, and market's price requirements for semiconductor memory chips limit the upper limit of memory chip testing costs. Therefore, how to provide a chip testing method, which has low test cost and high test precision and can effectively improve the test capability and test efficiency on a manufactured chip, has become one of the key factors for further improving the supply capacity and efficiency of chip suppliers.

In order to facilitate the understanding of the present application, the present application will be described more comprehensively below with reference to the relevant accompanying drawings. Preferred embodiments of the present application are given in the drawings. However, the present application may be implemented in many different forms, and is not limited to the embodiments described herein. Rather, these embodiments are provided so that the disclosure of the present application is more thorough and comprehensive.

Unless otherwise defined, all technological and scientific terms used herein have the same meanings as commonly understood by those of ordinary skill in the technical field of the present application. The terms used in the description of the present application are only for the purpose of describing specific embodiments, but are not intended to limit the present application. The term "and/or" used herein comprises any and all combinations of one or more relevant listed items.

It should be understood that, when an element or layer is referred to as being "on", "adjacent to", "connected to", or "coupled to" other element or layer, the element or layer may be directly on, adjacent to, connected to, or coupled to the other element or layer, or there may be an intermediate element or layer therebetween. In contrast, when an element is referred to as being "directly on", "directly adjacent to", "directly connected to", or "directly coupled to" other element or layer, there is no intermediate element or layer therebetween. It should be understood that, although the terms first, second, third, etc. may be used to describe various elements, components, regions, layers and/or portions, these elements, components, regions, layers and/or portions should not be restricted by these terms. These terms are only used to distinguish one element, component, region, layer or portion from another element, component, region, layer or portion. Therefore, the first element, component, region, layer or portion discussed below may be represented as a second element, component, region, layer or portion, without departing from the teachings of the present application.

Spatial relationship terms such as "under", "below", "lower", "beneath", "above", "upper", etc. may be used here to conveniently describe the relationship between one element or feature shown in the figure and other element or feature. It should be understood that, in addition to the orientations shown in the figures, the spatial relationship terms also include different orientations of devices in use and operation. For example, if a device in the figure is turned over, an element or feature described as "below" or "under" or "beneath" other element will be oriented "on" the other element or feature. Therefore, the exemplary terms "below" and "under" may include both orientations of above and below. The device may be oriented otherwise (rotated 90 degrees or oriented in other ways), and the spatial terms used herein are interpreted accordingly. The position term "upper" in the present application is from the user's perspective.

Referring to FIG. 1, in an embodiment of the present application, a chip testing board is provided, including a first conductive layer 10, a second conductive layer 20 and a third conductive layer 30. The first conductive layer 10 is located on a substrate 100, the first conductive layer 10 is configured to electrically connect with a first power connection point (not shown in FIG. 1) of a chip, and one side of the first conductive layer 10 leads to a first test point 11; the second conductive layer 20 is located on the first conductive layer 10, the second conductive layer 20 is configured to electrically connect with a second power connection point (not shown in FIG. 1) of the chip, and one side of the second conductive layer 20 leads to a second test point 12; the third conductive layer 30 is located on the second conductive layer 20, the third conductive layer 30 is configured to electrically connect with a third power connection point of the chip, and one side of the third conductive layer 30 leads to a third test point 13; wherein the first test point 11, the second test point 12 and the third test point 13 are all located at an edge of the same side of the substrate 100.

Specifically, continuing to refer to FIG. 1, the first conductive layer 10, the second conductive layer 20 and the third conductive layer 30 are arranged in order from bottom to top on the substrate 100, and every two of them are electrically isolated; wherein, the first conductive layer 10 is configured to electrically connect with the first power connection point of the chip, and one side of the first conductive layer 10 leads to the first test point 11; the second conductive layer 20 is configured to electrically connect with the second power connection point of the chip, and one side of the second conductive layer 20 leads to the second test point 12; the third conductive layer 30 is configured to electrically connect with the third power connection point of the chip, and one side of the third conductive layer 30 leads to the third test point 13, so that after the chip is placed in a test region 101 of the testing board, an excitation electrical signal is provided to the chip via the first power connection point, the second power connection point and the third power connection point, and a testing electrical signal is collected via the first test point 11, the second test point 12 and the third test point 13, wherein the excitation electrical signal may be a voltage signal or a current signal, and the testing electrical signal may be a voltage signal or a current signal; a reactance value of the chip is measured based on the excitation electrical signal and the testing electrical signal, for example, the excitation electrical signal may be set as a voltage signal U and the testing electrical signal may be set as a current signal I, then the reactance value S of the chip is calculated according to a formula U/I, and whether the chip meets the test standard is determined according to whether the resistance value, the capacitance value and the inductance value in the reactance value S are within corresponding threshold ranges. For example, if at least two of the calculated resistance value, the calculated capacitance value and the calculated inductance value in the reactance value S are not within the corresponding threshold ranges, it is determined that the chip does not meet the test standard; otherwise, it is determined that the chip meets the test standard. The chip testing board provided by the present application has a simple structure and low manufacturing cost, which reduces the manufacturing cost and difficulty of the testing board and effectively improves the test capability and test efficiency on the manufactured chip. When the chip is tested using the chip testing board, test impedance is substantially not introduced, so that the test on the impedance value of the chip is more accurate, and the accuracy of the test is effectively improved.

As an example, continuing to refer to FIG. 1, in an embodiment of the present application, the third conductive layer 30 includes a first rectangular conductive strip 31, and a second rectangular conductive strip 32 and a third rectangular conductive strip 33 that are parallel to each other; the first rectangular conductive strip 31 is vertically connected to both the second rectangular conductive strip 32 and the third rectangular conductive strip 33; the second rectangular conductive strip 32 and the third rectangular conductive strip 33 are located on the same side of the first rectangular conductive strip 31; the second rectangular conductive strip 32 has a length greater than that of the third rectangular conductive strip 33, and the end of the second rectangular conductive strip 32 away from the first rectangular conductive strip 31 is electrically connected to the third test point 13, so that after the chip is placed in the test region 101 of the testing board 100, the first power connection point of the chip is electrically connected to the first test point 11, the second power connection point of the chip is electrically connected to the second test point 12, the third power connection point of the chip is electrically connected to the third test point 13, and areas of the first conductive layer 10, the second conductive layer 20 and the third conductive layer 30 are reduced as much as possible, thereby reducing the test capacitance that may be caused by the chip testing board, to further improve the accuracy of chip testing.

Figure 2:
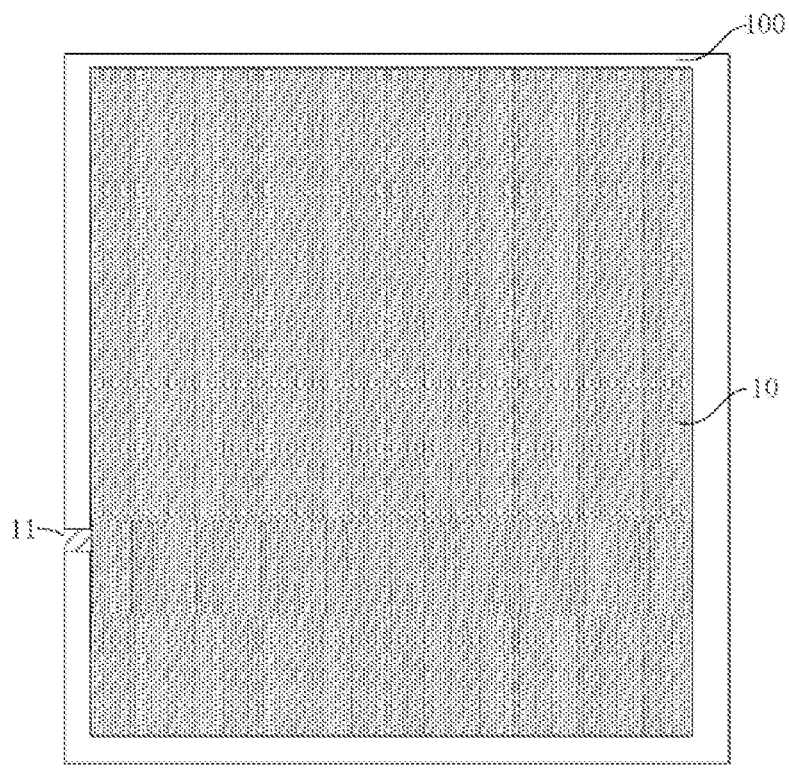
FIG. 2 is a schematic top view of a partial structure of the chip testing board illustrated in FIG. 1.

As an example, continuing to refer to FIGS. 1 and 2, in an embodiment of the present application, the first conductive layer 10 is rectangular, so that after the chip is placed in the test region 101 of the testing board 100, the first power connection point of the chip is electrically connected to the first test point 11, which lowers the production and manufacturing cost of the testing board while reducing the test capacitance that may be caused by the chip testing board, so as to further improve the accuracy of chip testing.

Figure 3:
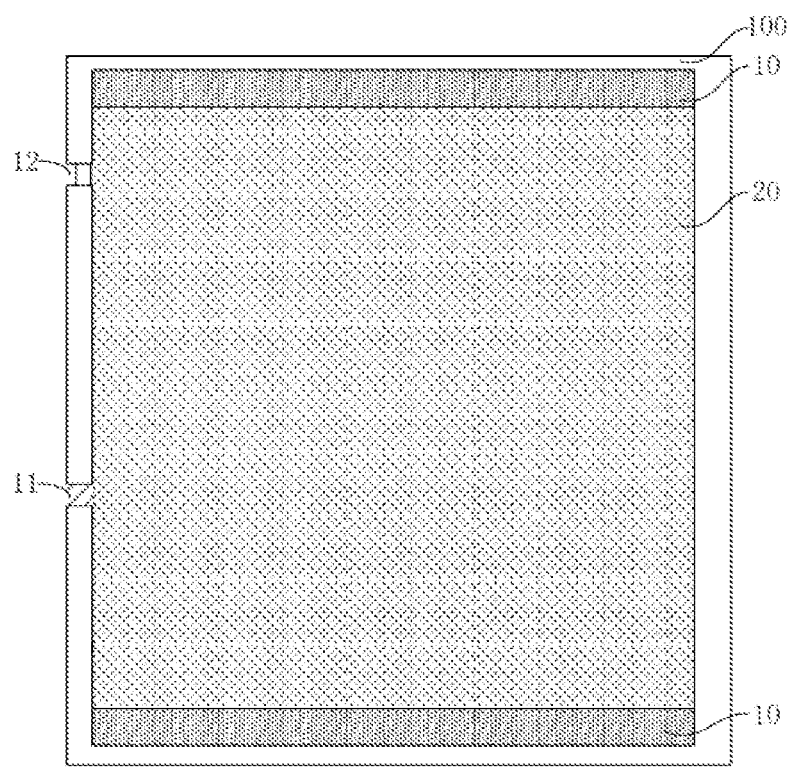
FIG. 3 is a schematic top view of a partial structure of the chip testing board illustrated in FIG. 1.

As an example, continuing to refer to FIGS. 1 and 3, in an embodiment of the present application, the second conductive layer 20 is rectangular, so that after the chip is placed in the test region 101 of the testing board 100, the second power connection point of the chip is electrically connected to the second test point 12, which lowers the production and manufacturing cost of the testing board while reducing the test capacitance that may be caused by the chip testing board, so as to further improve the accuracy of chip testing.

As an example, continuing to refer to FIGS. 1 to 3, in an embodiment of the present application, the first conductive layer 10, the second conductive layer 20, and the third conductive layer 30 are all made of copper.

As an example, continuing to refer to FIGS. 1 to 3, in an embodiment of the present application, the chip includes a memory chip, for example, the memory chip includes a Dynamic Random Access Memory (DRAM) chip.

Figure 4:
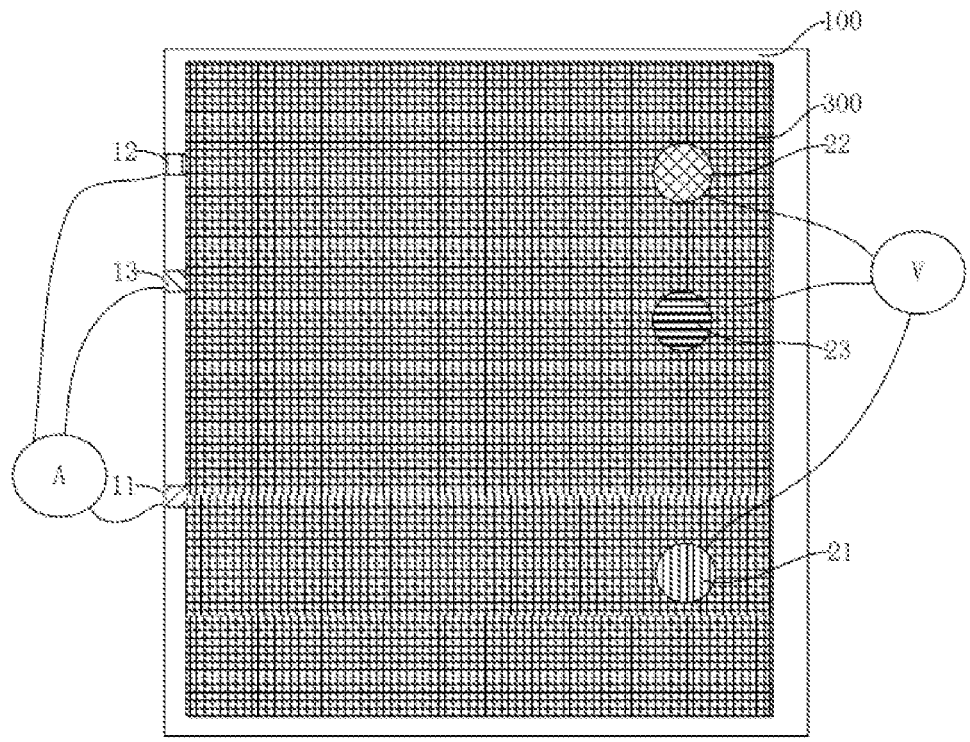
FIG. 4 is a schematic diagram of an application scenario of the chip testing board illustrated in FIG. 1.

As an example, referring to FIG. 4, in an embodiment of the present application, after the chip 300 is placed in the test region (not shown in FIG. 4) of the testing board, an excitation electrical signal is provided to the chip 300 via the first power connection point 21, the second power connection point 22 and the third power connection point 23, and a testing electrical signal is collected via the first test point 11, the second test point 12 and the third test point 13, wherein the excitation electrical signal may be a voltage signal or a current signal, and the testing electrical signal may be a voltage signal or a current signal; a reactance value of the chip is measured based on the excitation electrical signal and the testing electrical signal, and whether the chip meets the test standard is determined according to whether the resistance value, the capacitance value and the inductance value in the reactance value S are within corresponding threshold ranges. For example, if at least two of the resistance value, the capacitance value and the inductance value in the calculated reactance value S are not within the corresponding threshold ranges, it is determined that the chip does not meet the test standard; otherwise, it is determined that the chip meets the test standard. The chip testing board provided by the present application has a simple structure and low manufacturing cost, which reduces the manufacturing cost and difficulty of the testing board and effectively improves the test capability and test efficiency on the manufactured chip. When the chip is tested using the chip testing board, test impedance is substantially not introduced, so that the test on the impedance value of the chip is more accurate, and the accuracy of the test is effectively improved.

Figure 5:
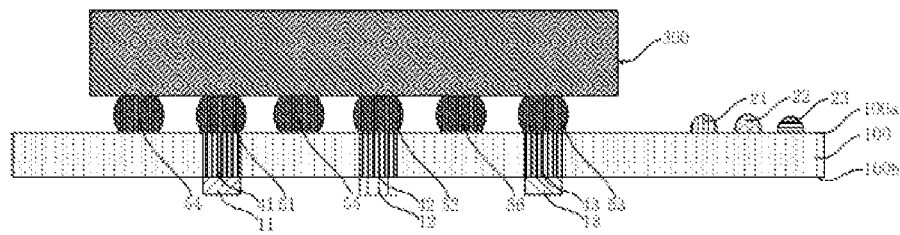
FIG. 5 is a schematic cross-sectional view of a chip testing board according to a second embodiment of the present application.

Further, referring to FIG. 5, in an embodiment of the present application, a chip testing board is provided, including a substrate 100 and a first conductive pillar 41, a second conductive pillar 42 and a third conductive pillar 43 that are located in the substrate 100 and isolated from each other, wherein a surface of the substrate 100 is provided with a first power connection point 21, a second power connection point 22 and a third power connection point 23; the substrate 100 has a first surface 100a and a second surface 100b opposite to each other, the first surface 100a is configured to place a chip 300, and the second surface 100b is provided with a first test point 11, a second test point 12 and a third test point 13; the first conductive pillar 41, the second conductive pillar 42 and the third conductive pillar 43 all penetrate the first surface 100a and the second surface 100b, the first conductive pillar 41 is configured to electrically connect a first conductive boss 51 of the chip 300 with the first test point 11, the second conductive pillar 42 is configured to electrically connect a second conductive boss 52 of the chip 300 with the second test point 12, and the third conductive pillar 43 is configured to electrically connect a third conductive boss 53 of the chip 300 with the third test point 13.

Specifically, continuing to refer to FIG. 5, the first conductive pillar 41, the second conductive pillar 42 and the third conductive pillar 43 that penetrate the first surface 100a of the substrate 100 and the second surface 100b opposite to the first surface 100a are disposed in the substrate 100, wherein the first surface 100a is configured to place the chip 300, and the second surface 100b is provided with the first test point 11, the second test point 12 and the third test point 13; the first conductive pillar 41 is configured to electrically connect the first conductive boss 51 of the chip 300 with the first test point 11, the second conductive pillar 42 is configured to electrically connect the second conductive boss 52 of the chip 300 with the second test point 12, and the third conductive pillar 43 is configured to electrically connect the third conductive boss 53 of the chip 300 with the third test point 13, so that after the chip 300 is placed in a test region of the testing board, an excitation electrical signal is provided to the chip 300 via the first power connection point 21, the second power connection point 22 and the third power connection point 23, and a testing electrical signal is collected via the first test point 11, the second test point 12 and the third test point 13; a reactance value of the chip is measured based on the excitation electrical signal and the testing electrical signal, and whether the chip meets the test standard is determined according to whether the resistance value, the capacitance value and the inductance value in the reactance value are within corresponding threshold ranges. The chip testing board provided by the present application has a simple structure and low manufacturing cost, which reduces the manufacturing cost and difficulty of the testing board and effectively improves the test capability and test efficiency on the manufactured chip. When the chip is tested using the chip testing board, test impedance is substantially not introduced, so that the test on the impedance value of the chip is more accurate, and the accuracy of the test is effectively improved.

As an example, in an embodiment of the present application, at least one of the first conductive boss 51, the second conductive boss 52 and the third conductive boss 53 is a solder ball.

As an example, continuing to refer to FIG. 5, in an embodiment of the present application, the first power connection point 21, the second power connection point 22 and the third power connection point 23 are disposed on the first surface 100a of the substrate 100; the first power connection point 21 is electrically connected to a fourth conductive boss 54 of the chip 300 via a first conductive wire (not shown) in the substrate 100; the second power connection point 22 is electrically connected to a fifth conductive boss 55 of the chip 300 via a second conductive wire (not shown) in the substrate 100; and the third power connection point 23 is electrically connected to a sixth conductive boss 56 of the chip 300 via a third conductive wire (not shown) in the substrate 100. As such, after the chip 300 is placed in the test region of the testing board, an excitation electrical signal is provided to the chip 300 via the first power connection point 21, the second power connection point 22 and the third power connection point 23, and a testing electrical signal is collected via the first test point 11, the second test point 12 and the third test point 13; a reactance value of the chip is measured based on the excitation electrical signal and the testing electrical signal, and whether the chip meets the test standard is determined according to whether the resistance value, the capacitance value and the inductance value in the reactance value are within corresponding threshold ranges.

As an example, in an embodiment of the present application, at least one of the fourth conductive boss 54, the fifth conductive boss 55 and the sixth conductive boss 56 is a solder ball.

As an example, continuing to refer to FIG. 5, in an embodiment of the present application, the chip 300 is a dynamic random access memory chip.

Figure 6:
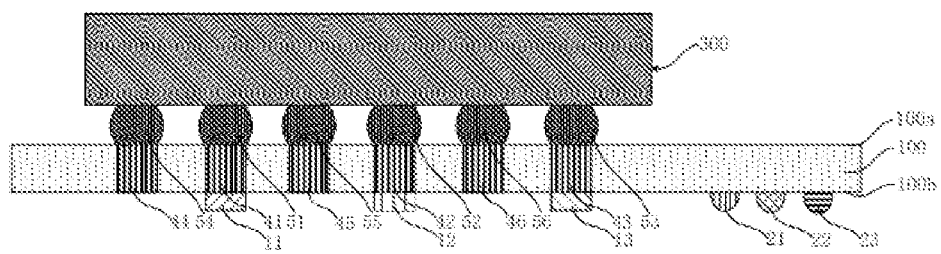
FIG. 6 is a schematic cross-sectional view of a chip testing board according to a third embodiment of the present application.

As an example, referring to FIG. 6, in an embodiment of the present application, the first power connection point 21, the second power connection point 22 and the third power connection point 23 are disposed on the second surface 100b of the substrate 100; a fourth conductive pillar 44, a fifth conductive pillar 45 and a sixth conductive pillar 46 that are isolated from each other are disposed in the substrate 100; the first power connection point 21 is electrically connected to the fourth conductive boss 54 of the chip 300 via the fourth conductive pillar 44; the second power connection point 22 is electrically connected to the fifth conductive boss 55 of the chip 300 via the fifth conductive pillar 45; and the third power connection point 23 is electrically connected to the sixth conductive boss 56 of the chip 300 via the sixth conductive pillar 46. For example, the first power connection point 21 may be electrically connected to the fourth conductive pillar 44 via a fourth conductive wire (not shown) in the substrate 100, the second power connection point 22 may be electrically connected to the fifth conductive pillar 45 via a fifth conductive wire (not shown) in the substrate 100, and the third power connection point 23 is electrically connected to the sixth conductive pillar 46 via a sixth conductive wire (not shown) in the substrate 100. As such, after the chip 300 is placed in the test region of the testing board, an excitation electrical signal is provided to the chip 300 via the first power connection point 21, the second power connection point 22 and the third power connection point 23, and a testing electrical signal is collected via the first test point 11, the second test point 12 and the third test point 13; a reactance value of the chip is measured based on the excitation electrical signal and the testing electrical signal, and whether the chip meets the test standard is determined according to whether the resistance value, the capacitance value and the inductance value in the reactance value are within corresponding threshold ranges.

Figure 7:
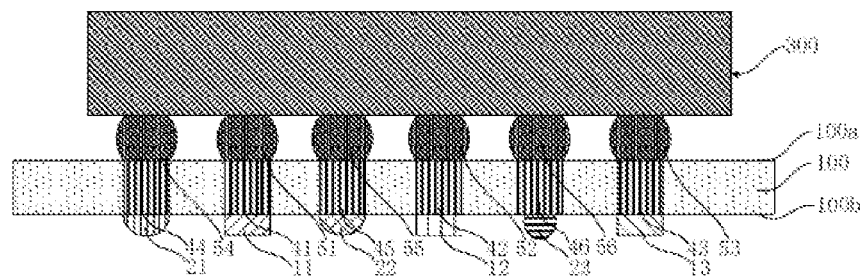
FIG. 7 is a schematic cross-sectional view of a chip testing board according to a fourth embodiment of the present application.

As an example, referring to FIG. 7, in an embodiment of the present application, the first power connection point 21 is disposed at the end of the fourth conductive pillar 44 close to the second surface 100b of the substrate 100, the second power connection point 22 is disposed at the end of the fifth conductive pillar 45 close to the second surface 100b of the substrate 100, and the third power connection point 23 is disposed at the end of the sixth conductive pillar 46 close to the second surface 100b of the substrate 100, which effectively shorten electrical distances between the first power connection point 21 and the fourth conductive pillar 44, between the second power connection point 22 and the fifth conductive pillar 45, and between the third power connection point 23 and the sixth conductive pillar 46.

Figure 8:
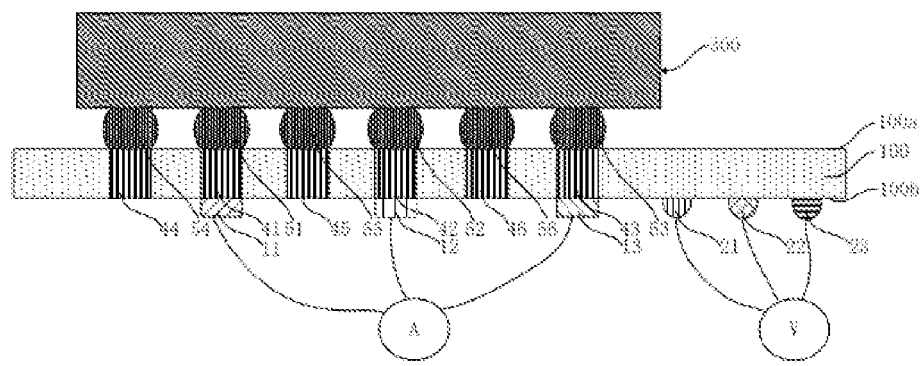
FIG. 8 is a schematic diagram of an application scenario of the chip testing board illustrated in FIG. 6.

As an example, referring to FIG. 8, in an embodiment of the present application, after the chip 300 is placed in the test region of the testing board, an excitation electrical signal is provided to the chip 300 via the first power connection point 21, the second power connection point 22 and the third power connection point 23, and a testing electrical signal is collected via the first test point 11, the second test point 12 and the third test point 13; a reactance value of the chip is measured based on the excitation electrical signal and the testing electrical signal, and whether the chip meets the test standard is determined according to whether the resistance value, the capacitance value and the inductance value in the reactance value are within corresponding threshold ranges. Because the chip testing board provided by the present application has a simple structure and low manufacturing cost, and the structural design of the conductive pillars effectively reduces the conductive cross-sectional area compared with the structural design of the conductive layers, which can further reduce the test impedance caused by the chip testing board and improve the accuracy of testing; this embodiment reduces the manufacturing cost and difficulty of the testing board, and effectively improves the test capability and test efficiency on the manufactured chip.

Figure 9:
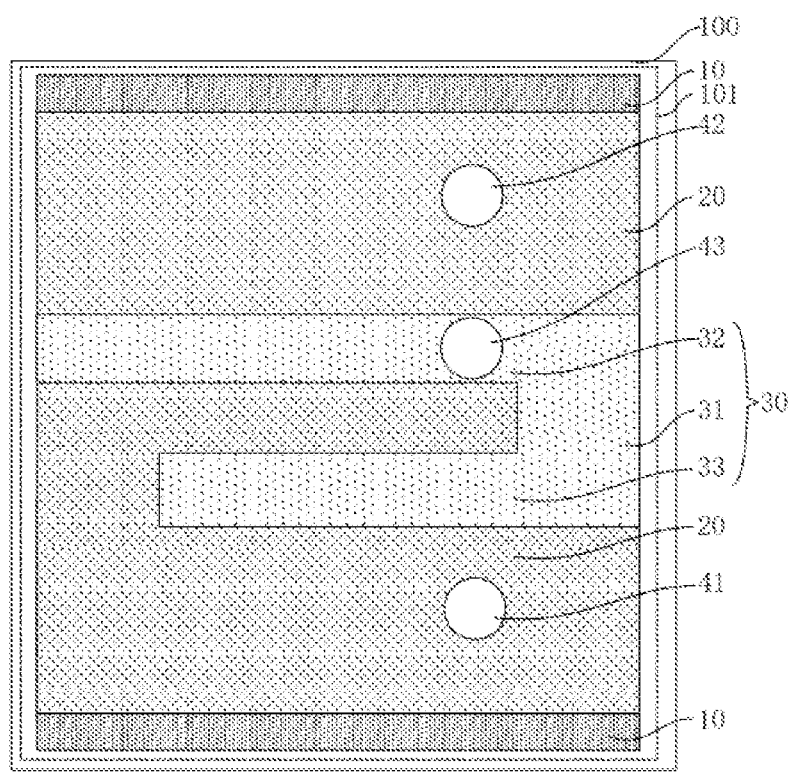
FIG. 9 is a schematic top view of a chip testing board according to a fifth embodiment of the present application.

Further, referring to FIGS. 9 and 4, in an embodiment of the present application, a chip testing board is provided, including a substrate 100, a first conductive layer 10, a second conductive layer 20 and a third conductive layer 30. The first conductive layer 10 is located on the substrate 100, and the first conductive layer 10 is configured to electrically connect with a first power connection point (not shown in FIG. 1) of the chip; the second conductive layer 20 is located on the first conductive layer 10, and the second conductive layer 20 is for electrical connection with a second power connection point (not shown in FIG. 1) of the chip; the third conductive layer 30 is located on the second conductive layer 20, and the third conductive layer 30 is configured to electrically connect with a third power connection point of the chip; a first conductive pillar 41, a second conductive pillar 42 and a third conductive pillar 43 are disposed in the substrate 100, the first conductive pillar 41 is electrically connected to the first conductive layer 10, the second conductive layer 20 is electrically connected to the second conductive pillar 42, and the third conductive layer 30 is electrically connected to the third conductive pillar 43; the first conductive pillar 41 is configured to electrically connect the first power connection point 21 of the chip 300 with a first test point 11, the second conductive pillar 42 is configured to electrically connect the second power connection point 22 of the chip 300 with a second test point 12, and the third conductive pillar 43 is configured to electrically connect the third power connection point 23 of the chip 300 with a third test point 13.

Specifically, continuing to refer to FIGS. 9, 4 and 5, the first test point 11, the second test point 12 and the third test point 13 may be all disposed at an edge of the same side of the substrate 100, for example, the first test point 11, the second test point 12 and the third test point 13 are all disposed on a lower surface of the substrate 100, the first test point 11 is electrically connected to a bottom surface of the first conductive pillar 41, the second test point 12 is electrically connected to a bottom surface of the second conductive pillar 42, and the third test point 13 is electrically connected to a bottom surface of the third conductive pillar 43, so as to effectively shorten the length of a testing current flow path. An excitation electrical signal is provided to the chip 300 via the first power connection point 21, the second power connection point 22 and the third power connection point 23, and a testing electrical signal is collected via the first test point 11, the second test point 12 and the third test point 13; a reactance value of the chip is measured based on the excitation electrical signal and the testing electrical signal, and whether the chip meets the test standard is determined according to whether the resistance value, the capacitance value and the inductance value in the reactance value are within corresponding threshold ranges. The chip testing board provided by the present application has a simple structure and low manufacturing cost, which reduces the manufacturing cost and difficulty of the testing board and effectively improves the test capability and test efficiency on the manufactured chip. When the chip is tested using the chip testing board, test impedance is substantially not introduced, so that the test on the impedance value of the chip is more accurate, and the accuracy of the test is effectively improved.

As an example, continuing to refer to FIGS. 9 and 1, in an embodiment of the present application, the third conductive layer 30 includes a first rectangular conductive strip 31, and a second rectangular conductive strip 32 and a third rectangular conductive strip 33 that are parallel to each other; the first rectangular conductive strip 31 is vertically connected to both the second rectangular conductive strip 32 and the third rectangular conductive strip 33; the second rectangular conductive strip 32 and the third rectangular conductive strip 33 are located on the same side of the first rectangular conductive strip 31; the second rectangular conductive strip 32 has a length greater than that of the third rectangular conductive strip 33, so that after the chip is placed in the test region 101 of the testing board 100, an excitation electrical signal is provided to the chip 300 via the first power connection point 21, the second power connection point 22 and the third power connection point 23, and a testing electrical signal is collected via the first test point 11, the second test point 12 and the third test point 13; a reactance value of the chip is measured based on the excitation electrical signal and the testing electrical signal, and whether the chip meets the test standard is determined according to whether the resistance value, the capacitance value and the inductance value in the reactance value are within corresponding threshold ranges.

As an example, in an embodiment of the present application, the chip 300 is a dynamic random access memory chip.

Further, in an embodiment of the present application, a chip testing method is provided, including:

Step 202, a chip testing board as described in any embodiment of the present application is provided;

Step 204, a chip is placed in the test region of the testing board; Step 206, an excitation electrical signal is provided to the chip via the first power connection point, the second power connection point and the third power connection point;

Step 208, a testing electrical signal is collected via the first test point, the second test point and the third test point;

Step 210, the chip is tested based on the excitation electrical signal and the testing electrical signal.

Specifically, in the chip testing method of the above embodiment, since the chip testing board as described in any embodiment of the present application is used, after the chip is placed in the test region of the chip testing board, an excitation electrical signal may be provided to the chip via the first power connection point, the second power connection point and the third power connection point, and a testing electrical signal is collected via the first test point, the second test point and the third test point; a reactance value of the chip is measured based on the excitation electrical signal and the testing electrical signal, and whether the chip meets the test standard is determined according to whether the resistance value, the capacitance value and the inductance value in the reactance value are within corresponding threshold ranges. The chip testing board provided by the present application has a simple structure and low manufacturing cost, which reduces the manufacturing cost and difficulty of the testing board and effectively improves the test capability and test efficiency on the manufactured chip. When the chip is tested using the chip testing board, test impedance is substantially not introduced, so that the test on the impedance value of the chip is more accurate, and the accuracy of the test is effectively improved.

For the specific limitations on the chip testing method in the above embodiment, reference may be made to the above limitations on the chip testing board, and details are not described herein again.

It should be noted that the above-mentioned embodiments are only for illustrative purposes and do not mean to limit the present application.

The embodiments in this specification are all described in a progressive manner. Each embodiment focuses on the differences from other embodiments, and the same or similar parts between the embodiments may be referred to each other.

The technical features of the above-mentioned embodiments may be combined arbitrarily. For the purpose of simplicity in description, all the possible combinations of the technical features in the above embodiments are not described. However, as long as the combinations of these technical features do not have contradictions, they shall fall within the scope of this specification.

The above-mentioned embodiments only describe several implementations of the present application, and their descriptions are specific and detailed, but cannot therefore be understood as limitations to the patent scope of the present application. It should be noted that a person of ordinary skill in the art may further make variations and improvements without departing from the conception of the present application, and these all fall within the protection scope of the present application. Therefore, the patent protection scope of the present application should be subject to the appended claims.

The invention claimed is:

1. A chip testing board, comprising:
a first conductive layer located on a substrate, the first conductive layer being configured to electrically connect with a first power connection point of a chip, and one side of the first conductive layer leading to a first test point;
a second conductive layer located on the first conductive layer, the second conductive layer being configured to electrically connect with a second power connection point of the chip, and one side of the second conductive layer leading to a second test point; and
a third conductive layer located on the second conductive layer, the third conductive layer being configured to electrically connect with a third power connection point of the chip, and one side of the third conductive layer leading to a third test point;
wherein, the first test point, the second test point, and the third test point are all located at an edge of the same side of the substrate.

2. The chip testing board according to claim 1, wherein the third conductive layer comprises a first rectangular conductive strip, and a second rectangular conductive strip and a third rectangular conductive strip that are parallel to each other;
the first rectangular conductive strip is vertically connected to both the second rectangular conductive strip and the third rectangular conductive strip;
the second rectangular conductive strip and the third rectangular conductive strip are located on the same side of the first rectangular conductive strip; and
the second rectangular conductive strip has a length greater than a length of the third rectangular conductive strip, and an end of the second rectangular conductive strip away from the first rectangular conductive strip is electrically connected to the third test point.

3. The chip testing board according to claim 2, wherein at least one of the first conductive layer and the second conductive layer is rectangular.

4. The chip testing board according to claim 1, wherein the first conductive layer, the second conductive layer and the third conductive layer are all made of copper.

5. The chip testing board according to claim 1, wherein the chip comprises a memory chip.

6. The chip testing board according to claim 5, wherein the memory chip comprises a dynamic random access memory chip.

7. A chip testing method, comprising:
providing the chip testing board according to claim 1;
placing a chip in a test region of the chip testing board;
providing an excitation electrical signal to the chip via the first power connection point, the second power connection point and the third power connection point;
collecting a testing electrical signal via the first test point, the second test point and the third test point; and
testing the chip based on the excitation electrical signal and the testing electrical signal.

8. The chip testing method according to claim 7, wherein the excitation electrical signal is a voltage signal or a current signal, and the testing electrical signal is a voltage signal or a current signal.

9. The chip testing method according to claim 8, wherein the testing the chip based on the excitation electrical signal and the testing electrical signal comprises:
measuring a reactance value of the chip based on the excitation electrical signal and the testing electrical signal, and determining whether the chip meets a test standard according to whether a resistance value, a capacitance value and an inductance value in the reactance value are within corresponding threshold ranges.

10. The chip testing method according to claim 9, wherein the determining whether the chip meets a test standard comprises: when at least two of a calculated resistance value, a calculated capacitance value and a calculated inductance value in the reactance value are not within the corresponding threshold ranges, determining that the chip does not meet the test standard; otherwise, determining that the chip meets the test standard.

11. A chip testing board, comprising:
a substrate having a first surface and a second surface opposite to each other, wherein a chip is disposed on the first surface, the second surface is provided with a first test point, a second test point and a third test point, and a first power connection point, a second power connection point and a third power connection point are arranged on the first surface or the second surface;
a first conductive pillar, a second conductive pillar and a third conductive pillar are disposed in the substrate;
the first conductive pillar is configured to electrically connect a first conductive boss of the chip with the first test point;
the second conductive pillar is configured to electrically connect a second conductive boss of the chip with the second test point; and
the third conductive pillar is configured to electrically connect a third conductive boss of the chip with the third test point.

12. The chip testing board according to claim 11, wherein the first power connection point, the second power connection point and the third power connection point are disposed on the first surface;
the first power connection point is electrically connected to a fourth conductive boss of the chip via a first conductive wire in the substrate;
the second power connection point is electrically connected to a fifth conductive boss of the chip via a second conductive wire in the substrate; and
the third power connection point is electrically connected to a sixth conductive boss of the chip via a third conductive wire in the substrate.

13. The chip testing board according to claim 12, wherein the first power connection point, the second power connection point and the third power connection point are disposed on the second surface;
a fourth conductive pillar, a fifth conductive pillar and a sixth conductive pillar are disposed in the substrate;

the first power connection point is electrically connected to the fourth conductive boss of the chip via the fourth conductive pillar;

the second power connection point is electrically connected to the fifth conductive boss of the chip via the fifth conductive pillar; and the third power connection point is electrically connected to the sixth conductive boss of the chip via the sixth conductive pillar.

14. The chip testing board according to claim 13, wherein the first power connection point is disposed at an end of the fourth conductive pillar close to the second surface;

the second power connection point is disposed at an end of the fifth conductive pillar close to the second surface; and the third power connection point is disposed at an end of the sixth conductive pillar close to the second surface.

15. The chip testing board according to claim 12, wherein at least one of the fourth conductive boss, the fifth conductive boss and the sixth conductive boss is a solder ball.

16. The chip testing board according to claim 11, wherein the chip comprises a dynamic random access memory chip.

17. The chip testing board according to claim 11, wherein at least one of the first conductive boss, the second conductive boss and the third conductive boss is a solder ball.

18. A chip testing board, comprising:
a substrate, in the substrate a first conductive pillar, a second conductive pillar and a third conductive pillar are disposed;

a first conductive layer, disposed on an upper surface of the substrate, an upper surface of the first conductive layer being configured to electrically connect with a first power connection point of a chip, and the first conductive layer being electrically connected to a first test point via the first conductive pillar;

a second conductive layer, disposed on the first conductive layer, an upper surface of the second conductive layer being configured to electrically connect with a second power connection point of the chip, and the second conductive layer being electrically connected to a second test point via the second conductive pillar; and a third conductive layer, disposed on the second conductive layer, an upper surface of the third conductive layer being configured to electrically connect with a third power connection point of the chip, and the third conductive layer being electrically connected to a third test point via the third conductive pillar.

19. The chip testing board according to claim 18, wherein the third conductive layer comprises a first rectangular conductive strip, and a second rectangular conductive strip and a third rectangular conductive strip that are parallel to each other;

the first rectangular conductive strip is vertically connected to both the second rectangular conductive strip and the third rectangular conductive strip;

the second rectangular conductive strip and the third rectangular conductive strip are located on the same side of the first rectangular conductive strip; and the second rectangular conductive strip has a length greater than a length of the third rectangular conductive strip.

20. The chip testing board according to claim 18, wherein the chip comprises a dynamic random access memory chip.

* * * * *